(12) United States Patent
Anderson

(10) Patent No.: US 11,791,817 B2
(45) Date of Patent: Oct. 17, 2023

(54) INPUT SUPPLY CIRCUIT AND METHOD FOR OPERATING AN INPUT SUPPLY CIRCUIT

(71) Applicant: NXP USA, Inc., Austin, TX (US)

(72) Inventor: Alma Anderson, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/398,796

(22) Filed: Aug. 10, 2021

(65) Prior Publication Data
US 2023/0047185 A1    Feb. 16, 2023

(51) Int. Cl.
| | | |
|---|---|---|
| H03K 17/687 | (2006.01) | |
| H03K 3/356 | (2006.01) | |
| H03K 19/00 | (2006.01) | |
| H03K 19/08 | (2006.01) | |
| H03K 19/173 | (2006.01) | |

(52) U.S. Cl.
CPC ... *H03K 17/6872* (2013.01); *H03K 3/356113* (2013.01); *H03K 19/0021* (2013.01); *H03K 19/0813* (2013.01); *H03K 19/1737* (2013.01)

(58) Field of Classification Search
CPC .................. H03K 17/04; H03K 17/042; H03K 17/04206; H03K 17/06; H03K 17/063; H03K 17/08; H03K 17/082; H03K 17/0822; H03K 17/22; H03K 17/223; H03K 17/30; H03K 17/302; H03K 17/687; H03K 17/6871; H03K 17/6872; H03K 19/0021; H03K 19/0027; H03K 19/01; H03K 19/017; H03K 19/0813; H03K 19/1737; H03K 3/356113
See application file for complete search history.

(56) References Cited

U.S. PATENT DOCUMENTS

| | | | |
|---|---|---|---|
| 6,288,599 B1* | 9/2001 | Coddington ... | H03K 19/018585 327/530 |
| 6,346,829 B1* | 2/2002 | Coddington ....... | H03K 19/0027 326/83 |
| 7,173,472 B2* | 2/2007 | Chen .................. | H03K 19/0027 327/333 |
| 9,899,912 B2* | 2/2018 | Raghupathy ............ | H02M 3/07 |

\* cited by examiner

*Primary Examiner* — Long Nguyen

(57) ABSTRACT

Embodiments of input supply circuits and methods for operating an input supply circuit are described. In one embodiment, an input supply circuit includes a bias circuit configured to define a voltage threshold in response to an input signal, and an input buffer configured to generate an output signal in response to the voltage threshold. Other embodiments are also described.

15 Claims, 6 Drawing Sheets

INPUT SUPPLY CIRCUIT AND METHOD FOR OPERATING AN INPUT SUPPLY CIRCUIT

BACKGROUND

An input supply circuit can be used to provide an operating voltage to one or more components of a device, such as an integrated circuit (IC). In an input supply circuit, it may be desirable to have an input threshold voltage that tracks an external supply voltage that is not present in the input supply circuit. In addition, in an input supply circuit, it may also be desirable to have the option to switch between an input threshold voltage and a supply voltage range. Furthermore, in an input supply circuit, it is typically desirable to have a low quiescent current draw in order to reduce power consumption. Therefore, there is a need for an input supply circuit that has an input threshold voltage that can track an external supply voltage, is switchable between an input threshold voltage and a supply voltage range, and has a low quiescent current draw.

SUMMARY

Embodiments of input supply circuits and methods for operating an input supply circuit are described. In one embodiment, an input supply circuit includes a bias circuit configured to define a voltage threshold in response to an input signal, and an input buffer configured to generate an output signal in response to the voltage threshold. Other embodiments are also described.

In an embodiment, the voltage threshold is lower than a supply voltage that is applied to the input supply circuit.

In an embodiment, the voltage threshold is equal to a faction of an external supply that is lower than the supply voltage and is not present in the input supply circuit.

In an embodiment, the voltage threshold is equal to a supply voltage that is applied to the input supply circuit.

In an embodiment, the bias circuit is further configured to define the voltage threshold based on the input signal and the output signal that is fed back from the input buffer to the bias circuit.

In an embodiment, the bias circuit include semiconductor devices, resistors connected to the semiconductor devices, and capacitors connected to the semiconductor devices and to the resistors.

In an embodiment, the input supply circuit further includes a multiplexer configured to allow or disallow the input signal to pass through, the semiconductor devices include a first NMOS transistor having a drain terminal connected to a supply voltage and a gate terminal connected to the multiplexer, where the first NMOS transistor is configured to sense the input signal and to charge a first capacitor of the capacitors based on an input voltage of the input signal.

In an embodiment, the semiconductor devices further include a second NMOS transistor having a drain terminal connected to a first resistor of the resistors and a gate terminal connected to the multiplexer, a third NMOS transistor having a drain terminal connected to a source terminal of the second NMOS transistor and a gate terminal connected to the output signal that is fed back from the input buffer to the bias circuit, and a PMOS transistor having a gate terminal connected to the first capacitor and to the first resistor and a drain terminal connected to a fixed voltage.

In an embodiment, the semiconductor devices further include a fourth NMOS transistor having a gate terminal and a drain terminal connected to a second resistor of the resistors and a source terminal connected to the PMOS transistor, a fifth NMOS transistor having a drain terminal connected to the supply voltage and a gate terminal connected to the second resistor, and a sixth NMOS transistor having a gate terminal connected to a source termina of the fifth NMOS transistor.

In an embodiment, the fixed voltage is zero volt.

In an embodiment, the bias circuit further includes a standby bias unit configured to control one of the capacitors from discharging to a fixed voltage.

In an embodiment, the input supply circuit further includes a multiplexer configured to allow or disallow the input signal to pass through.

In an embodiment, the multiplexer is further configured to allow the input signal to pass through to the bias circuit when a desired input range of the input supply circuit overlaps with a supply voltage that is applied to the input supply circuit.

In an embodiment, the multiplexer is further configured to disallow the input signal to pass through to the bias circuit when a desired input range of the input supply circuit is lower than the supply voltage that is applied to the input supply circuit.

In an embodiment, the input buffer includes a frontend unit connected to the bias circuit, a level shifter connected to the frontend unit, and an output buffer configured to output the output signal to a load.

In an embodiment, the input buffer includes inverters.

In an embodiment, an input supply circuit includes a multiplexer configured to allow or disallow an input signal to pass through, a bias circuit configured to define a voltage threshold in response to the input signal, an input buffer configured to generate an output signal in response to the voltage threshold, and a filter configured to filter the output signal to generate a filtered signal.

In an embodiment, the bias circuit is further configured to define the voltage threshold based on the input signal and the output signal that is fed back from the input buffer to the bias circuit, and the input buffer is configured to generate the output signal in response to the voltage threshold and the filtered signal.

In an embodiment, the bias circuit includes semiconductor devices, resistors connected to the semiconductor devices, and capacitors connected to the semiconductor devices and to the resistors.

In an embodiment, a method for operating an input supply circuit involves allowing or disallowing an input signal to pass through to a bias circuit, at the bias circuit, defining a voltage threshold in response to the input signal, and generating an output signal in response to the voltage threshold.

Other aspects and advantages of embodiments of the present invention will become apparent from the following detailed description, taken in conjunction with the accompanying drawings, depicted by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
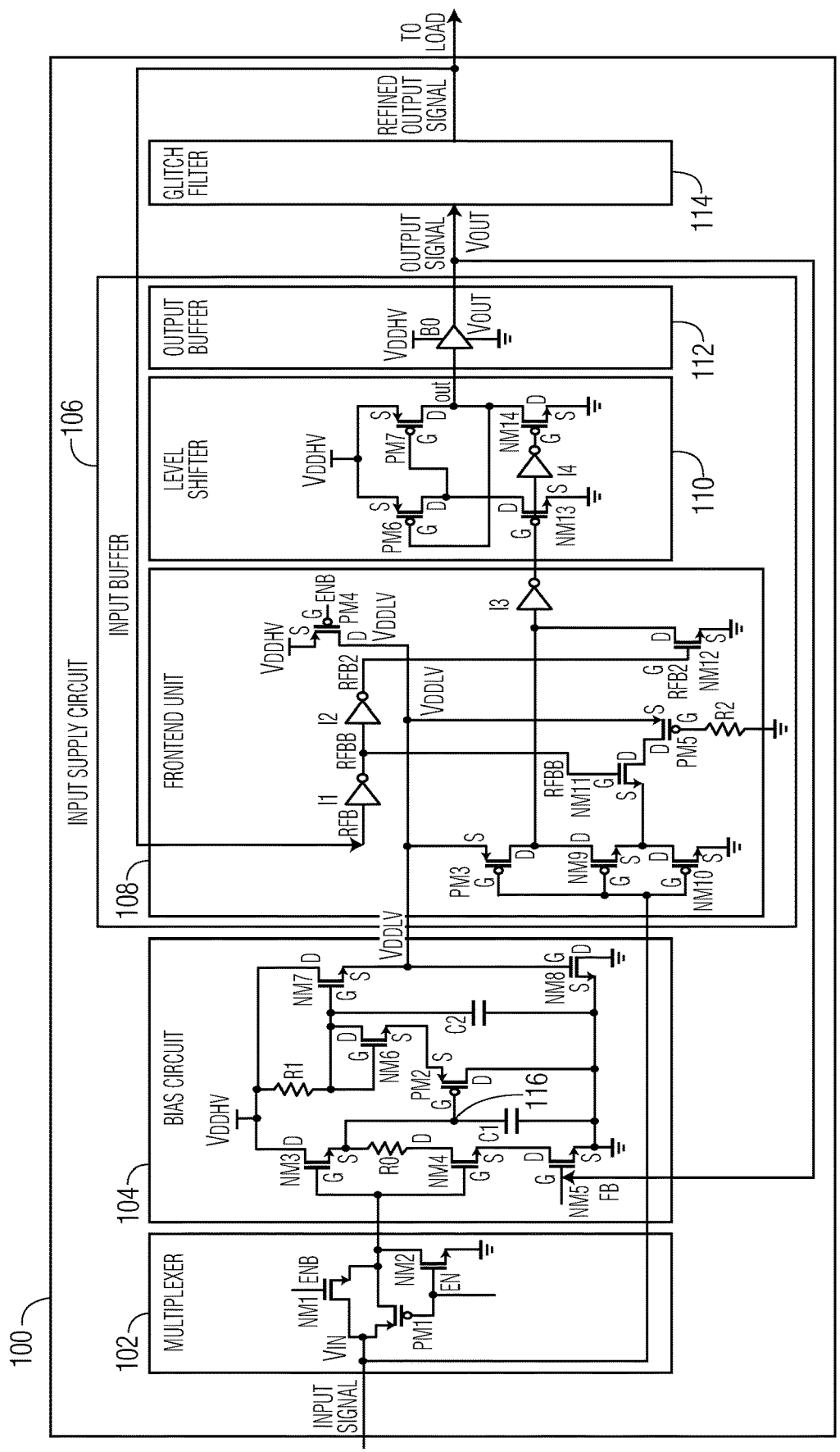
FIG. 1 is a schematic block diagram of an input supply circuit in accordance with an embodiment of the invention.

FIG. 1 is a schematic block diagram of an input supply circuit 100 in accordance with an embodiment of the invention. In the embodiment depicted in FIG. 1, the input supply circuit 100 includes a multiplexer 102, a bias circuit 104, and an input buffer 106, which includes a frontend unit 108, a level shifter 110, an output buffer 112, and an optional glitch filter 114. The multiplexer 102, the bias circuit 104, and/or the input buffer 106 may be implemented at least one transistor device, such as at least one a metal-oxide-semiconductor (MOS) device. The input supply circuit 100 receives an input voltage or a supply voltage, "$V_{IN}$," and outputs an output signal having an output voltage, "$V_{OUT}$," for a load 120, which may be an IC chip. The input and output voltages of the input supply circuit can be any suitable type of Direct Current (DC) voltages. The input supply circuit can be used to provide an operating voltage for components of an IC. Although the input supply circuit is shown in FIG. 1 as including certain components, in some embodiments, the input supply circuit includes less or more components to implement less or more functionalities. For example, the input supply circuit may include a glitch filter 114 that is connected to the output buffer and configured to filter the output signal having the output voltage, $V_{OUT}$, to generate a filtered signal. In another example, in some embodiments, the input supply circuit includes an electrostatic discharge (ESD) protection unit that is electrically connected to the multiplexer 102, the bias circuit 104, and/or the input buffer 106 to provide ESD protection.

In the embodiment depicted in FIG. 1, the multiplexer 102 is configured to allow or disallow (i.e., reject) the input signal having the input voltage, $V_{IN}$, to pass through, e.g., to the bias circuit 104. In some embodiments, the multiplexer is further configured to allow the input signal having the input voltage, $V_{IN}$, to pass through to the bias circuit 104 when a desired input range of the input supply circuit 100 overlaps with a supply voltage, $V_{DDHV}$, which is applied to the input supply circuit through, for example, a high voltage supply rail. In some embodiments, the multiplexer is further configured to disallow the input signal having the input voltage, $V_{IN}$, to pass through to the bias circuit when a desired input range of the input supply circuit is lower than the supply voltage, $V_{DDHV}$, which is applied to the input supply circuit through, for example, a high voltage supply rail. In the embodiment depicted in FIG. 1, the multiplexer 102 includes an NMOS transistor, NM1, a PMOS transistor, PM1, and another NMOS transistor, NM2. The NMOS transistor, NM1, and the PMOS transistor, PM1, form a pass switch, which can be located between an input secondary ESD protection and the bias circuit 104. The pass switch can be used to disable the bias circuit 104 when a desired input voltage range is identical as the supply voltage, $V_{DDHV}$. For example, complementary control signals, ENB, EN are applied to the NMOS transistors, NM1, NM2, respectively (e.g., to the gate terminals of the NMOS transistors, NM1, NM2, respectively), to control the passage of the input signal having the input voltage, $V_{IN}$. The NMOS transistor, NM2, discharges the bias circuit to a fixed voltage, such as ground (0V), when the pass switch formed by the NMOS transistor, NM1, and the PMOS transistor, PM1, is turned off. In some embodiments, the multiplexer 102 is not included in the input supply circuit 100 (e.g., in an application where only a low voltage input is wanted or used, and the input voltage range is not a supply voltage for the input supply circuit 100).

In the embodiment depicted in FIG. 1, the bias circuit 104 is configured to define a voltage threshold in response to the input signal having the input voltage, $V_{IN}$. In the embodiment depicted in FIG. 1, the bias circuit 104 includes six NMOS transistors, NM3, NM4, NM5, NM6, NM7, NM8, a PMOS transistor, PM2, two capacitors, C1, C2, and two resistors R0, R1. The input terminal to the bias circuit is the gate terminals, G, of the NMOS transistors, NM3, NM4. The NMOS transistor, NM3, is a source fallower with its drain terminal, D, connected to the high voltage supply rail having the voltage, $V_{DDHV}$, of the input supply circuit 100 and its source terminal, S, connected to a reference storage node 116 between the capacitor, C1, the resistor, R0, and the PMOS transistor, PM2. The NMOS transistor, NM3, is configured to sense the input signal having the input voltage, $V_{IN}$, and to charge the capacitor, C1, based on the input voltage, $V_{IN}$, of the input signal. The resistor, R0, is connected to the source terminal, S, of the NMOS transistor, NM3, and to the drain terminal, D, of the NMOS transistor, NM4. The source terminal, S, of the NMOS transistor, NM4, is connected to the drain terminal, D, of the NMOS transistor, NM5. The source terminal, S, of the NMOS transistor, NM5, is connected to ground and the gate terminal, G, of the NMOS transistor, NM5, is connected to an output signal, which is fed back from the output of the output buffer 112. The resistor R0, the NMOS transistor, NM4, and the NMOS transistor, NM5 form a discharge path for the reference storage node 116, which is activated when both the input signal and the input buffer output are at high voltage, thus loading the source terminal, S, of the NMOS transistor, NM3, when the input signal is at high voltage and not discharging the capacitor, C1, when the input voltage, $V_{IN}$, falls below a threshold. The PMOS transistor, PM2, the NMOS transistor, NM6, the resistor, R1, and the capacitor, C2, form a bias and filtering function that translates the reference storage voltage the reference storage node 116 up to a threshold above the input pin high voltage, $V_{IN}$. The drain terminal, D, of the PMOS transistor, PM2, is connected to ground to dump the current supplied by the resistor, R1, when the voltage drop across the resistor, R1, is equal to the supply voltage minus the input pin voltage plus a threshold voltage. The source terminal, S, of the PMOS transistor, PM2, is connected to the source terminal, S, of the NMOS transistor, NM6. The gate terminal, G, and the drain terminal, D, of the NMOS transistor, NM6, are connected to the lower end of the resistor, R1, the capacitor, C2, and the gate terminal, G, of the NMOS transistor, NM7 and create the bias for the NMOS transistor, NM7. The capacitor, C2, filters the voltage on the gate terminal, G, of the NMOS transistor, NM7 such that there are neither fast rising nor fast falling spikes on the gate terminal, G, of the NMOS transistor, NM7. The NMOS transistor, NM7, is used as a source follower with its drain terminal, D, connected to the high voltage supply rail having the voltage, $V_{DDHV}$, and its source terminal, S, connected to a capacitive element (e.g., the gate terminal, G, of the NMOS transistor, NM8, with the source terminal, S, and the drain terminal, D, tied to ground). The gate terminal, G, of the NMOS transistor, NM8, is connected to the low voltage supply pin of the input buffer 106. Because the input buffer has a dynamic current when it switches, the gate to source/drain capacitance of the NMOS transistor, NM8, is used to supply some of that current.

In the bias circuit 104 depicted in FIG. 1, when the input voltage, $V_{IN}$, is high, there is a load path on the source of the NMOS transistor, NM3, to define the threshold of the NMOS transistor, NM3, which is turned off when the input voltage, $V_{IN}$, is low. The gate terminal, G, of the PMOS transistor, PM2, is connected to the reference storage node 116, while the drain terminal, D, of the PMOS transistor, PM2, is connected to a low voltage (e.g., ground) that is able to sink current. The threshold voltage of the NMOS and PMOS transistors, NM3, PM2, are the same magnitude but opposite in sign. The source terminal, S, of the diode-tied NMOS transistor, NM6, is connected to the source terminal, S, of the PMOS transistor, PM2, which represents one NMOS threshold. Compared to a sample and hold circuit that uses a clock signal to define the sample time and the hold time, in the bias circuit 104 depicted in FIG. 1, the input signal having the input voltage, $V_{IN}$, is used to define the sample time and the hold time. When the input signal having the input voltage, $V_{IN}$, goes high, the NMOS source follower (e.g., the NMOS transistor, NM3) charges the storage node capacitor, C1. The threshold of the NMOS transistor, NM3, is a nonlinear function of current, and a resistive pull-down load, R0, is used to stabilize the threshold of the NMOS transistor, NM3. Consequently, the input supply circuit 100 can have an input threshold voltage that tracks an external supply voltage that is not present in the input supply circuit. In addition, the input supply circuit 100 can switch between an input threshold voltage and a supply voltage range. In addition, no static current is drawn from the input of the input supply circuit 100. Consequently, compared with a voltage converter, such as an upshift level translator, a simple series diode circuit, or a low drop out regulator (LDO), the input supply circuit 100 can have a low quiescent current draw and a low power consumption.

In some embodiments, the input supply circuit 100 is used in applications such as Inter-Integrated Circuit (I$^2$C) where two or more pins (Serial Data (SDA) and Serial Clock (SCL)) operate at the same voltage, elements of the bias circuit 104 can be shared. For example, the resistor, R0, the capacitor, C1, the PMOS transistor, PM2, the NMOS transistor, NM6, and the capacitor, C2. With each input pin having its own pass switch (e.g., formed by the NMOS transistors, NM1, NM2, and the PMOS transistor, PM1, of the multiplexer 102) and bias input transistors NM3, NM4, and feedback transistor, NM5, and its own output transistors, NM7 and NM8.

In the embodiment depicted in FIG. 1, the input buffer 106 is configured to generate the output signal having the output voltage, $V_{OUT}$, in response to the voltage threshold defined by the bias circuit 104. In some embodiments, the voltage threshold is lower than the supply voltage, $V_{DDHV}$, which is applied to the input supply circuit 100 through, for example, a high voltage supply rail. In some embodiments, the voltage threshold is equal to a faction of an external supply that is lower than the supply voltage and is not present in the input supply circuit. In some embodiments, the voltage threshold is equal to a supply voltage that is applied to the input supply circuit. In some embodiments, the bias circuit is further configured to define the voltage threshold based on the input signal having the input voltage, $V_{in}$, and the output signal having the output voltage, $V_{OUT}$, which is fed back from the input buffer 106 to the bias circuit. The bias circuit may include semiconductor devices, resistors connected to the semiconductor devices, and capacitors connected to the semiconductor devices and to the resistors.

In the embodiment depicted in FIG. 1, the input buffer 106 includes a frontend unit 108, a level shifter 110, and an output buffer 112. The frontend unit 108 includes three inverters I1, I2, I3, three PMOS transistors, PM3, PM4, PM5, three NMOS transistors, NM9, NM10, NM11, and a resistor, R2. The PMOS transistor, PM4, allows a voltage level selection signal to determine the threshold of the input by connecting the high voltage supply voltage (on the source terminal, S) to be connected to the low voltage node of the front end of the input (on the drain terminal, D) when the select signal, ENB, (on the gate terminal, G) is at ground. A level select signal allows the threshold to be tuned separately for the low voltage mode and the high voltage mode. The input signal with the input voltage, $V_{in}$, is applied to the gate terminals, G, of the PMOS transistor, PM3, and the NMOS transistors, NM9, NM10. The source terminal, S, of the PMOS transistor, PM3 is connected to the low voltage supply, $V_{DDLV}$, that is output from the bias circuit 104. The drain terminal, D, of the PMOS transistor, PM4, and the source terminal, D, of the PMOS transistor, PM5, are connected to the low voltage supply, $V_{DDLV}$, that is output from the bias circuit 104. The drain terminal, D, of the PMOS transistor, PM3, the drain terminal, D, of the NMOS transistor, NM9, the drain terminal, D, of the NMOS transistor, NM12, and the input of the inverter, I3, are connected to each other. The source terminal, S, of the NMOS transistor, NM9, is connected to the drain terminal, D, of the NMOS transistor, NM10, and the source terminal, S, of the NMOS transistor, NM11. The gate terminal, G, of the NMOS transistor, NM11, is connected to an inverted copy, RFBB, of the remote feedback signal, RFB, which is fed back, for example, from a glitch filter 114 connected to the output of the output buffer 112 and configured to filter the output signal having the output voltage, $V_{OUT}$, to generate the remote feedback signal, RFB. In some embodiments, the bias circuit 104 is configured to define a voltage threshold based on the input signal having the input voltage, $V_{IN}$, and the output signal having the output voltage, $V_{OUT}$, which is fed back from the input buffer to the bias circuit, and the input buffer 106 is configured to generate the output signal having the output voltage, $V_{OUT}$, in response to the voltage threshold and the remote feedback signal, RFB. The drain terminal, D, of the NMOS transistor, NM11, is connected to the drain terminal, D, of the PMOS transistor, PM5, whose gate terminal, G, is connected through the resistor R2 to ground. The NMOS transistor, NM11, and the PMOS transistor, PM5, form a current load on input NMOS devices to shift the threshold up, and the NMOS transistor, NM12, loads the PMOS transistor, PM3 to shift the threshold down. The gate terminal, G, of the NMOS transistor, NM12, is connected to a noninverted copy, RFB2, of the remote feedback signal, RFBB, and the source terminal, S, of the NMOS transistor, NM12, is connected to ground. The source terminal, S, of the PMOS transistor, PM4, is connected to the high voltage supply rail having the voltage, $V_{DDHV}$, and the gate terminal, G, of the PMOS transistor, PM4, is connected to the control signal, ENB. When it is at ground the PMOS transistor, PM4, is turned on (i.e., being conductive) and the input is in high voltage mode.

In the embodiment depicted in FIG. 1, the level shifter 110 includes an inverter, I4, two PMOS transistors, PM6, PM7, and two NMOS transistors, NM13, NM14. The output of the frontend unit 108 (e.g., the inverter I3) is connected to the input of the inverter, I4, and to the gate terminal, G, of the NMOS transistor, NM13. The output of the inverter, I4, is connected to the gate terminal, G, of the NMOS transistor, NM14. The drain terminal, D, of the NMOS transistor, NM13, is connected to the drain terminal, D, of the PMOS transistor, PM6, and the gate terminal, G, of the PMOS transistor, PM7. The drain terminal, D, of the NMOS transistor, NM14, is connected to the drain terminal, D, of the PMOS transistor, PM7, and the gate terminal, G, of the PMOS transistor, PM6. When the input changes, one of the NMOS transistors, NM13, NM14 is turned off (i.e., not conductive) and the other is turned on (i.e., conductive) then the cross coupled PMOS transistors, PM6 and PM7, change such that the one that was off turns on and as the node between the PMOS drain and the NMOS drain moves up the other PMOS transistor is turned off such that current only flows on the transition.

In the embodiment depicted in FIG. 1, the output buffer 112 is configured to output the output signal having the output signal, $V_{OUT}$, for example, to a load. In the embodiment depicted in FIG. 1, the output buffer 112 includes a high voltage buffer, B0. The level shifter output, the drain terminal, D, of the NMOS transistor, NM14, and the drain terminal, D, of the PMOS transistor, PM7, are connected to the input of the high voltage buffer, B0, whose output having the output voltage, $V_{OUT}$, drives a next stage (e.g., a load).

In an example operation of the input supply circuit 100, the input signal having the input voltage, $V_{IN}$, is applied to the NMOS transistor, NM1, and the PMOS transistor, PM1, of the multiplexer 102 and the gate terminals, G, of the PMOS transistor, PM3, and the NMOS transistors, NM9, NM10. The input signal having the input voltage, $V_{IN}$, may be applied to a secondary ESD protection circuit such that the input signal passes from an input pad through the secondary ESD protection circuit. In a low voltage input operation mode, the EN control signal is low, and the ENB signal is high, the NMOS transistor, NM1, and the PMOS transistor, PM1, are turned on (i.e., conductive) and the NMOS transistor, NM2, is turned off (i.e., not conductive). Consequently, the input signal having the input voltage, $V_{IN}$, passes through the pass gates of the NMOS transistor, NM1, and the PMOS transistor, PM1, to the gate terminals, G, of the NMOS transistors, NM3 and NM4. The NMOS transistor, NM3, acts as a source fallower and pulls up the node 116 at the top of the resistor, R0, the top of the capacitor, C1, and the gate terminal, G, of the PMOS transistor, PM2. The node 116 stores the maximum high input voltage from the source follower, NM3, on the capacitor, C1. Because the threshold of the source follower, NM3, is current dependent, the resistor, R0, loads the source follower, NM3, when the input voltage, $V_{IN}$, is higher than a threshold voltage (e.g., 0.8 V), and the input buffer 106 receives a voltage high long enough to propagate to the output of the input buffer. The feedback signal, FB, is applied to the gate terminal, G, of the NMOS transistor, NM5, and is from the output of the input buffer 106. When the input signal having the input voltage, $V_{IN}$, is high, the NMOS transistors, NM4 and NM5, are turned on such that the resistor, R0, loads the source terminal, S, of the NMOS transistor, NM3, to stabilize the threshold. However, when the gate terminal, G, of either the NMOS transistor, NM5, or the NMOS transistor, NM4, is at a low voltage, the resistor, R0, does not discharge the capacitor, C1. Consequently, the threshold below the input voltage, $V_{IN}$, is stored on the capacitor, C1. The PMOS transistor, PM2, operates as a sense PMOS with its source terminal, S, at a threshold above the voltage at the gate terminal, G. The NMOS transistor, NM6, is diode tied such that the voltage at its gate/drain terminals, G, D, are a threshold above the voltage at the source terminal, S, of the PMOS transistor, PM2. The resistor, R1, provides the current for the PMOS transistor, PM2, and the NMOS transistor, NM6, as well as charges the capacitor, C2. The NMOS transistor, NM7, acts as a source follower to provide the current to power the low voltage supply, $V_{DDLV}$. The NMOS transistor, NM8, is used as a capacitor on the source terminal, S, of the NMOS transistor, NM7.

The low voltage supply, $V_{DDLV}$, which is output from the bias circuit 104, supplies the source terminals, S, of the PMOS transistors, PM3, PM5, and the drain terminal, D, of the PMOS transistor, PM4, which is turned off for low voltage operation. The input signal having the input voltage, $V_{IN}$, is applied to the gate terminals, G, of the PMOS transistor, PM3, and the NMOS transistors, NM9 and NM10. The NMOS transistor, NM11, lifts the high threshold by putting extra current into the drain terminal, D, of the NMOS transistor, NM10, when the remote feedback signal, RFB, is low and the gate terminal, G, of the NMOS transistor, NM11, is high driven by the RFBB signal. The combination of the PMOS transistor, PM5, and the resistor, R2, pull the gate terminal, G, of the PMOS transistor, PM5, to ground and form a resistance between the drain termina, D, of the NMOS transistor, NM11, and the low voltage supply, $V_{DDLV}$. The NMOS transistor, NM12, pulls current from the PMOS transistor, PM3, to push down the input threshold, when the RFB2 signal is high. Consequently, the hysteresis is determined by the NMOS transistors, NM11 and NM12. The inverter, I3, compliments the inversion of the input first stage to make the net signal noninverting. The inverters, I1, and I2, provide a buffered inverted copy of the remote feedback signal, RFBB, and a noninverted copy, RFB2.

The output of the frontend unit 108 drives the level shifter 110, specifically the NMOS transistor, NM13, and the input of the inverter I4. The NMOS transistors, NM13, and NM14, drive complementary signals to the cross coupled weak PMOS transistors, PM6, and PM7. Because the PMOS pull-up of the level shifter is weak, it is followed by a noninverting buffer, B0. This buffered signal is used to drive the feedback signal, FB, in the bias circuit 104. For I2C pins, the glitch filter 114 is connected to the buffered output and the RFB signal is taken from the output of the glitch filter such that the threshold does not change until after the glitch filter delay. When the input signal having the input voltage, $V_{IN}$, is operated in the higher voltage mode, the gate terminal, G, of the PMOS transistor, PM4, is pulled low by the control signal, ENB, such that the PMOS transistor, PM4 pulls the low voltage supply, $V_{DDLV}$, that is output from the bias circuit 104 to the voltage, $V_{DDHV}$, of the high voltage supply rail.

Figure 2:
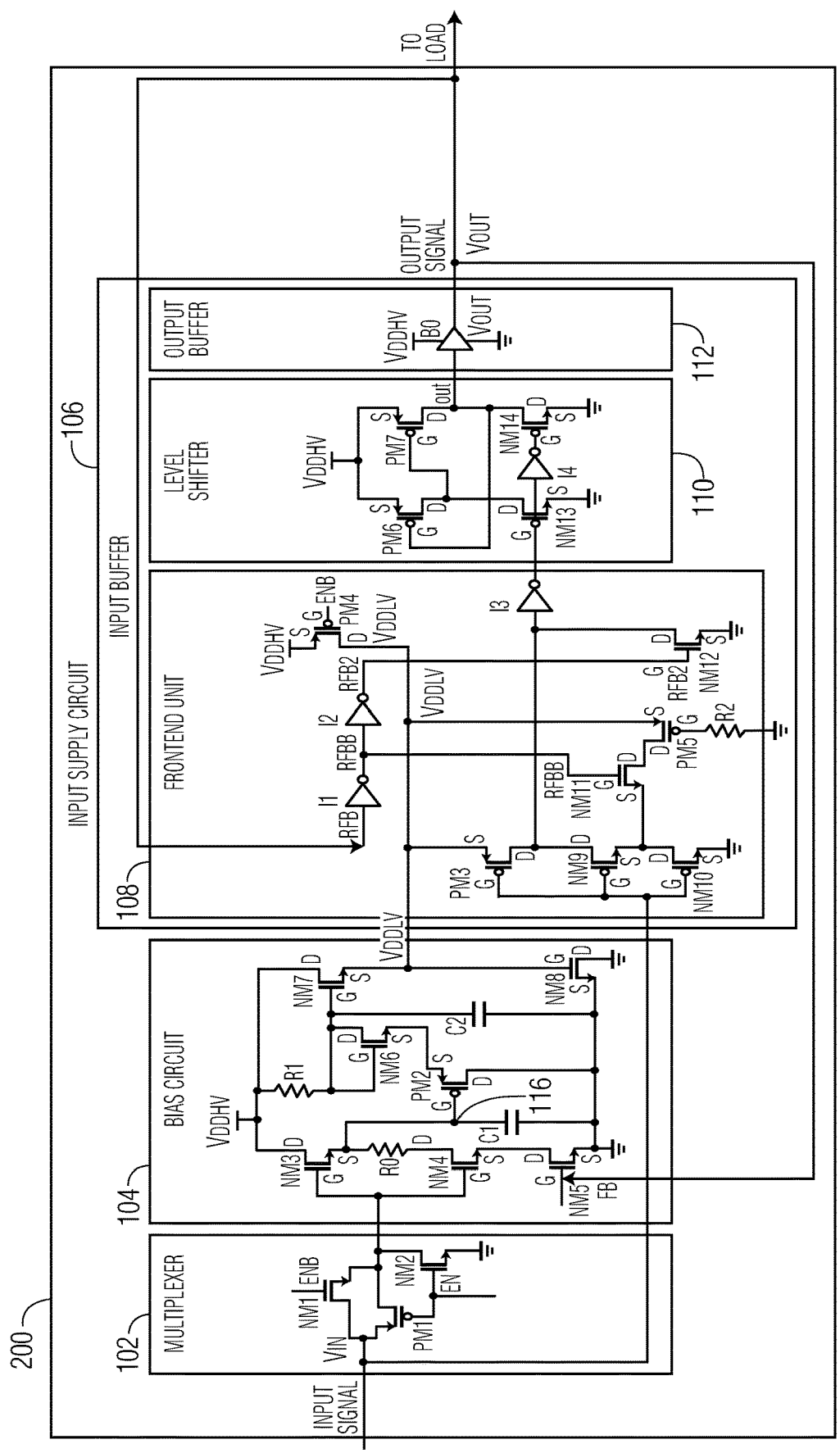
FIG. 2 is a schematic block diagram of an input supply circuit in accordance with another embodiment of the invention.

In some embodiments, the feedback signal, FB, is used to as the RFB signal in the input buffer 106. FIG. 2 is a schematic block diagram of an input supply circuit 200 in accordance with an embodiment of the invention in which the feedback signal, FB, is used to as the RFB signal in the input buffer 106. In the embodiment depicted in FIG. 2, the input supply circuit 200 includes the multiplexer 102, the bias circuit 104, and the input buffer 106, which includes the frontend unit 108, the level shifter 110, and the output buffer 112. Differences between the input supply circuit 200 depicted in FIG. 2 and the input supply circuit 100 depicted in FIG. 1 is that the input supply circuit 200 depicted in FIG. 2 does not include the glitch filter 114 and that the feedback signal, FB, is used to directly drive the RFB signal in the input buffer 106.

Figure 3:
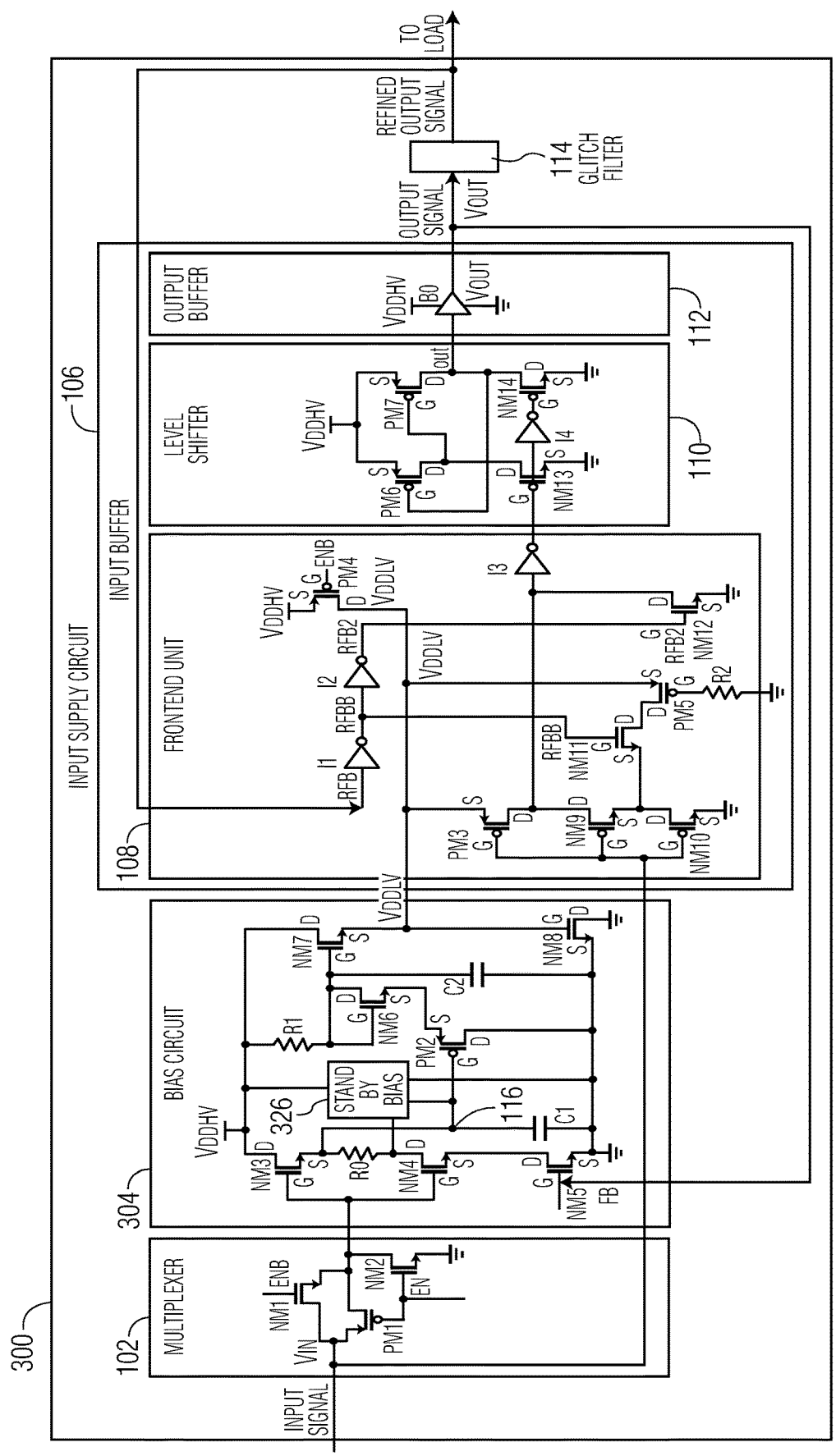
FIG. 3 is a schematic block diagram of an input supply circuit in accordance with another embodiment of the invention.

In some embodiments, a standby bias unit is included in the bias circuit 104 to control (e.g., keep or prevent) the capacitor, C1, from discharging to a fixed voltage such as ground. The standby bias unit may include a three-threshold transistor stack and a pull-down circuit. FIG. 3 is a schematic block diagram of an input supply circuit 300 in accordance with an embodiment of the invention in which a standby bias unit 326 is included in a bias circuit 304 to control (e.g., keep or prevent) the capacitor, C1, from discharging to ground. In the embodiment depicted in FIG. 3, the input supply circuit 300 includes the multiplexer 102, the bias circuit 304, and the input buffer 106, which includes the frontend unit 108, the level shifter 110, and the output buffer 112, and the glitch filter 114. A difference between the input supply circuit 300 depicted in FIG. 3 and the input supply circuit 100 depicted in FIG. 1 is that the bias circuit 304 of the input supply circuit 300 depicted in FIG. 3 includes the standby bias unit 326 configured to control (e.g., keep or prevent) the capacitor, C1, from discharging to ground. Specifically, the standby bias unit 326 is connected between the bias circuit 104 to the voltage, $V_{DDHV}$, of the high voltage supply rail, the node 116 between the capacitor, C1, the resistor, R0, and the PMOS transistor, PM2, the NMOS transistor, NM4, the resistor, R0, and ground. Because the input signal with the input voltage, $V_{in}$, can be low for an extended period of time, the capacitor, C1, can discharged to ground for the first low to high transition. It is necessary to set the switch point when the input voltage, $V_{in}$, and the supply voltage (i.e., the voltage, $V_{DDHV}$, of the high voltage supply rail) are rising at the same time such that it is within the threshold specification. In the embodiment depicted in FIG. 3, the standby bias unit 326 keeps the capacitor, C1, from discharging to ground.

Figure 4:
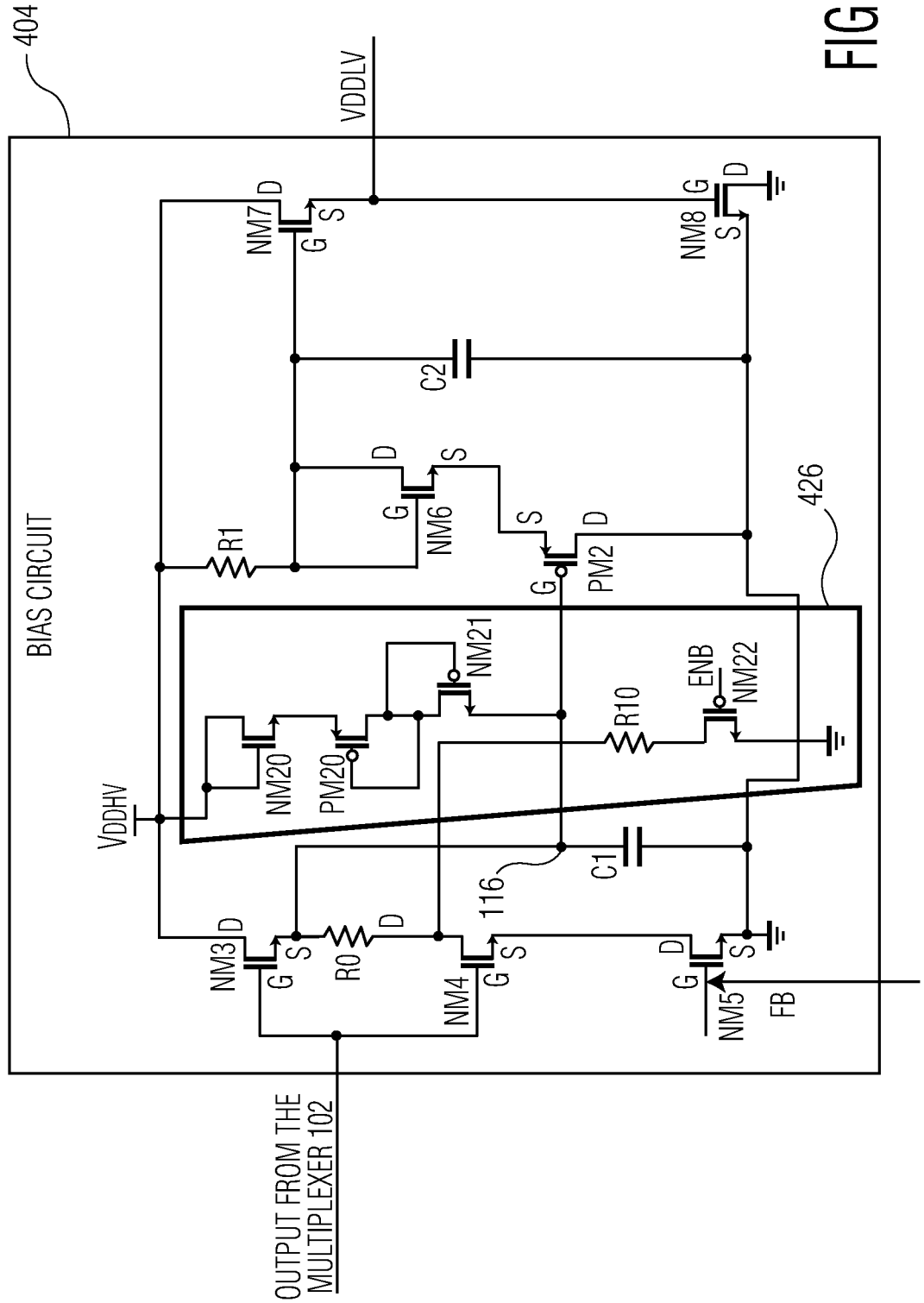
FIG. 4 depicts a bias circuit in accordance with an embodiment of the invention.

FIG. 4 depicts a bias circuit 404 in accordance with an embodiment of the invention. The bias circuit 404 depicted in FIG. 4 is an embodiment of the bias circuit 304 depicted in FIG. 3. However, the bias circuit 304 depicted in FIG. 3 is not limited to the embodiment shown in FIG. 4. In the embodiment depicted in FIG. 4, the bias circuit 404 includes the NMOS transistors, NM3, NM4, NM5, NM6, NM7, NM8, the PMOS transistor, PM2, the capacitors, C1, C2, the resistors R0, R1, and a standby bias unit 426. The standby bias unit 426 depicted in FIG. 4 is an embodiment of the standby bias unit 326 depicted in FIG. 3. However, the standby bias unit 326 depicted in FIG. 3 is not limited to the embodiment shown in FIG. 4. In the embodiment depicted in FIG. 4, the standby bias unit 426 includes NMOS transistors, NM20, NM21, NM22, a PMOS transistor, PM20, and a resistor, R10. The NMOS transistors, NM20, NM21, and the PMOS transistor, PM20, form a three-threshold stack to keep the C1 node (i.e., the node 116 between the capacitor, C1, the resistor, R0, and the PMOS transistor, PM2) from floating up and an additional pull-down formed by the resistor, R10, which is connected to the NMOS transistor, NM4, and the NMOS transistor, NM22, which is enabled by the control signal, ENB.

Figure 5:
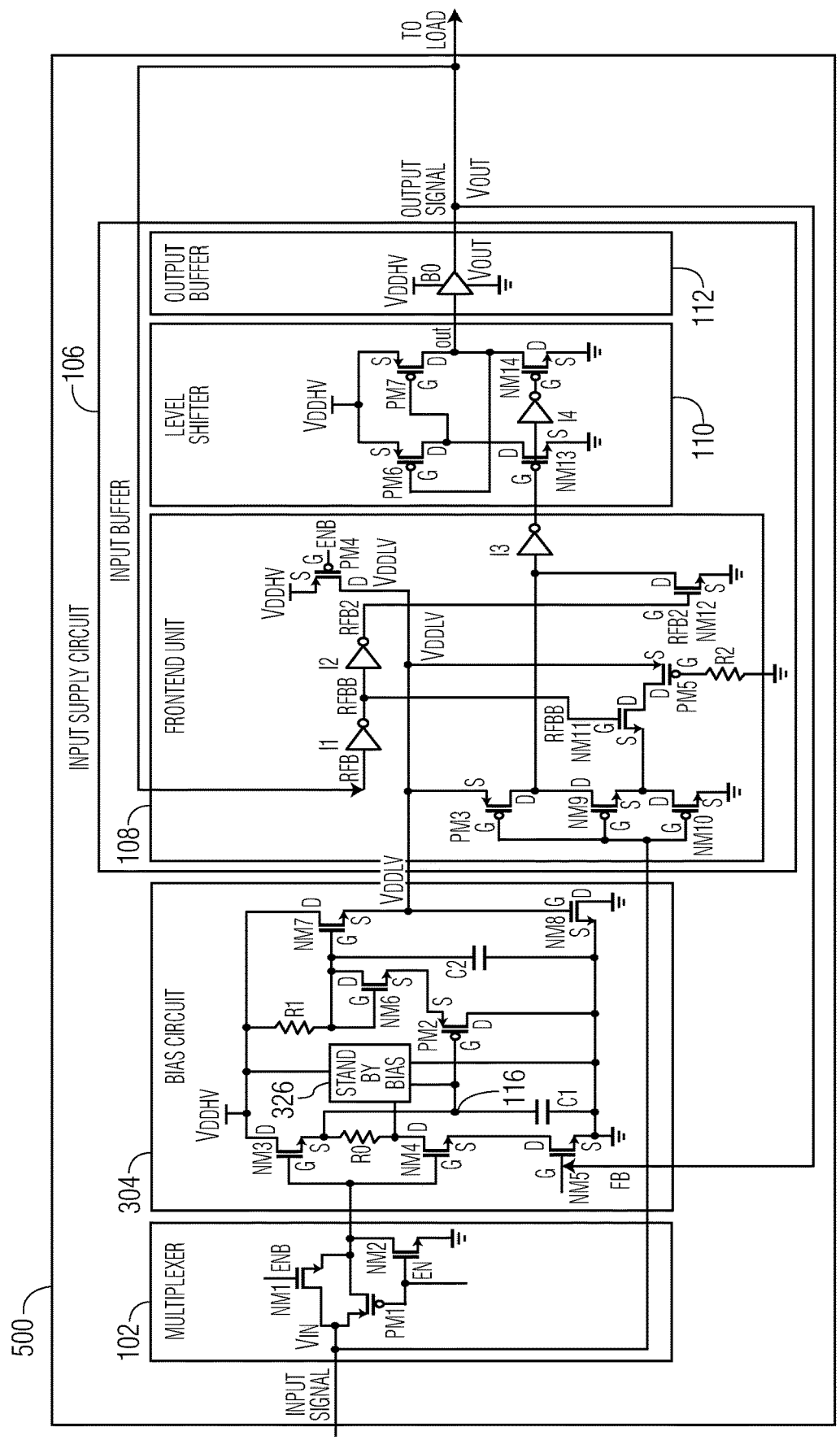
FIG. 5 is a schematic block diagram of an input supply circuit in accordance with another embodiment of the invention.

In some embodiments, the feedback signal, FB, is used to as the RFB signal in the input buffer 106. FIG. 5 is a schematic block diagram of an input supply circuit 500 in accordance with an embodiment of the invention in which the feedback signal, FB, is used to as the RFB signal in the input buffer 106. In the embodiment depicted in FIG. 5, the input supply circuit 500 includes the multiplexer 102, the bias circuit 304, and the input buffer 106, which includes the frontend unit 108, the level shifter 110, and the output buffer 112. Differences between the input supply circuit 500 depicted in FIG. 5 and the input supply circuit 300 depicted in FIG. 3 is that the input supply circuit 500 depicted in FIG. 5 does not include the glitch filter 114 and that the feedback signal, FB, is used to directly drive the RFB signal in the input buffer 106.

Figure 6:
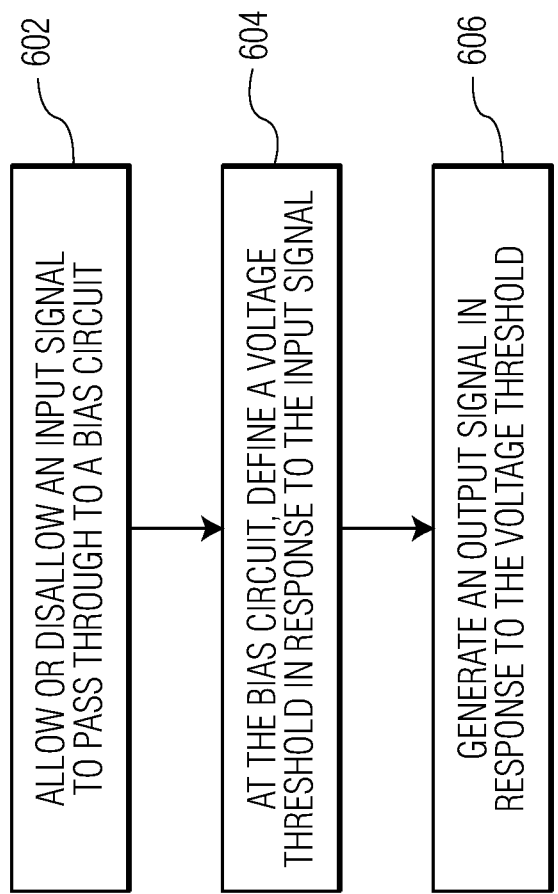
FIG. 6 is a process flow diagram of a method for operating an input supply circuit in accordance with an embodiment of the invention.

FIG. 6 is a process flow diagram of a method for operating an input supply circuit in accordance with an embodiment of the invention. The input supply circuit may be similar to or the same as the input supply circuit 100 depicted in FIG. 1, the input supply circuit 200 depicted in FIG. 2, the input supply circuit 300 depicted in FIG. 3, and/or the input supply circuit 500 depicted in FIG. 5. At block 602, an input signal is allowed or disallowed to pass through to a bias circuit. At block 604, at the bias circuit, a voltage threshold is defined in response to the input signal. At block 606, an output signal is generated in response to the voltage threshold.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program. The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, electrically erasable programmable read-only memory (EEPROM), a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An input supply circuit comprising:
   a bias circuit configured to define a voltage threshold in response to an input signal, wherein the bias circuit comprises a plurality of semiconductor devices, a plurality of resistors, and a plurality of capacitors;
   an input buffer configured to generate an output signal in response to the voltage threshold; and
   a multiplexer configured to allow or disallow the input signal to pass through to the bias circuit, wherein the plurality of semiconductor devices of the bias circuit comprises:
      a first NMOS transistor having a drain terminal connected to a supply voltage and a gate terminal connected to the multiplexer, wherein the first NMOS transistor is configured to sense the input signal and to charge a first capacitor of the plurality of capacitors based on an input voltage of the input signal.

2. The input supply circuit of claim 1, wherein the voltage threshold is lower than a supply voltage that is applied to the input supply circuit.

3. The input supply circuit of claim 2, wherein the voltage threshold is equal to a fraction of an external supply that is lower than the supply voltage and is not present in the input supply circuit.

4. The input supply circuit of claim 1, wherein the voltage threshold is equal to a supply voltage that is applied to the input supply circuit.

5. The input supply circuit of claim 1, wherein the bias circuit is further configured to define the voltage threshold based on the input signal and the output signal that is fed back from the input buffer to the bias circuit.

6. The input supply circuit of claim 1, wherein the semiconductor devices further comprise:
   a second NMOS transistor having a drain terminal connected to a first resistor of the resistors and a gate terminal connected to the multiplexer;
   a third NMOS transistor having a drain terminal connected to a source terminal of the second NMOS transistor and a gate terminal connected to the output signal that is fed back from the input buffer to the bias circuit; and
   a PMOS transistor having a gate terminal connected to the first capacitor and to the first resistor and a drain terminal connected to a fixed voltage.

7. The input supply circuit of claim 6, wherein the semiconductor devices further comprise:
   a fourth NMOS transistor having a gate terminal and a drain terminal connected to a second resistor of the resistors and a source terminal connected to the PMOS transistor;
   a fifth NMOS transistor having a drain terminal connected to the supply voltage and a gate terminal connected to the second resistor; and
   a sixth NMOS transistor having a gate terminal connected to a source terminal of the fifth NMOS transistor.

8. The input supply circuit of claim 6, wherein the fixed voltage is ground.

9. The input supply circuit of claim 1, wherein the bias circuit further comprises a standby bias unit configured to control one of the capacitors from discharging to a fixed voltage.

10. The input supply circuit of claim 9, wherein the multiplexer is further configured to allow the input signal to pass through to the bias circuit when a desired input range of the input supply circuit overlaps with a supply voltage that is applied to the input supply circuit.

11. The input supply circuit of claim 10, wherein the multiplexer is further configured to disallow the input signal to pass through to the bias circuit when a desired input range of the input supply circuit is lower than the supply voltage that is applied to the input supply circuit.

12. The input supply circuit of claim 1, wherein the input buffer comprises a frontend unit connected to the bias circuit, a level shifter connected to the frontend unit, and an output buffer configured to output the output signal to a load.

13. The input supply circuit of claim 1, wherein the input buffer comprises a plurality of inverters.

14. An input supply circuit comprising:
   a multiplexer configured to allow or disallow an input signal to pass through;
   a bias circuit configured to define a voltage threshold in response to the input signal, the bias circuit comprising a plurality of semiconductor devices and a plurality of capacitors, wherein the plurality of semiconductor devices comprises:
      a first transistor having a drain terminal connected to a supply voltage and a gate terminal connected to the multiplexer, wherein the first NMOS transistor is configured to sense the input signal and to charge a first capacitor of the plurality of capacitors based on an input voltage of the input signal;
   an input buffer configured to generate an output signal in response to the voltage threshold; and a filter configured to filter the output signal to generate a filtered signal.

15. The input supply circuit of claim 14, wherein the bias circuit is further configured to define the voltage threshold based on the input signal and the output signal that is fed back from the input buffer to the bias circuit, and wherein the input buffer is configured to generate the output signal in response to the voltage threshold and the filtered signal.

* * * * *